(12) United States Patent
Shih et al.

(10) Patent No.: US 8,951,884 B1
(45) Date of Patent: Feb. 10, 2015

(54) METHOD FOR FORMING A FINFET STRUCTURE

(71) Applicant: United Microelectronics Corp., Hsin-Chu (TW)

(72) Inventors: Hung-Lin Shih, Hsinchu (TW); Jei-Ming Chen, Tainan (TW); Chih-Chien Liu, Taipei (TW); Chin-Fu Lin, Tainan (TW); Kuan-Hsien Li, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/079,648

(22) Filed: Nov. 14, 2013

(51) Int. Cl.
*H01L 21/76* (2006.01)
*H01L 29/423* (2006.01)
*H01L 21/8234* (2006.01)
*H01L 21/02* (2006.01)
*H01L 21/306* (2006.01)

(52) U.S. Cl.
CPC .. *H01L 29/42364* (2013.01); *H01L 21/823431* (2013.01); *H01L 21/02164* (2013.01); *H01L 21/30604* (2013.01)
USPC .......................................... 438/424; 438/703

(58) Field of Classification Search
CPC ............... H01L 21/823821; H01L 21/823857; H01L 21/845; H01L 29/4908; H01L 29/66795; H01L 29/78603
USPC ......... 438/703, 275, 585, 197, 311, 217, 424; 257/368, 409
See application file for complete search history.

(56) References Cited

U.S. PATENT DOCUMENTS

| | | | |
|---|---|---|---|
| 5,498,768 | A | 3/1996 | Nishitani |
| 6,043,138 | A | 3/2000 | Ibok |
| 6,063,698 | A | 5/2000 | Tseng |
| 6,251,761 | B1 | 6/2001 | Rodder |
| 6,380,104 | B1 | 4/2002 | Yu |
| 6,492,216 | B1 | 12/2002 | Yeo |
| 6,492,217 | B1 | 12/2002 | Bai |
| 6,642,066 | B1 | 11/2003 | Halliyal |
| 6,656,852 | B2 | 12/2003 | Rotondaro |
| 6,696,345 | B2 | 2/2004 | Chau |
| 6,818,517 | B1 | 11/2004 | Maes |
| 6,818,553 | B1 | 11/2004 | Yu |
| 6,841,484 | B2 | 1/2005 | Ying |
| 6,921,711 | B2 | 7/2005 | Cabral, Jr. |
| 6,921,963 | B2 | 7/2005 | Krivokapic |
| 7,012,027 | B2 | 3/2006 | Perng |
| 7,030,430 | B2 | 4/2006 | Doczy |
| 7,087,477 | B2 | 8/2006 | Fried |

(Continued)

*Primary Examiner* — Yu-Hsi D Sun
*Assistant Examiner* — Christina Sylvia
(74) *Attorney, Agent, or Firm* — Winston Hsu; Scott Margo

(57) ABSTRACT

A method for forming a FinFET structure includes providing a substrate, a first region and a second region being defined on the substrate, a first fin structure and a second fin structure being disposed on the substrate within the first region and the second region respectively. A first oxide layer cover the first fin structure and the second fin structure. Next a first protective layer and a second protective layer are entirely formed on the substrate and the first oxide layer in sequence, the second protective layer within the first region is removed, and the first protective layer within the first region is then removed. Afterwards, the first oxide layer covering the first fin structure and the second protective layer within the second region are removed simultaneously, and a second oxide layer is formed to cover the first fin structure.

11 Claims, 5 Drawing Sheets

(56) References Cited

U.S. PATENT DOCUMENTS

| | | |
|---|---|---|
| 7,091,551 B1 | 8/2006 | Anderson |
| 7,115,947 B2 | 10/2006 | Clark, Jr. |
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |
| 7,208,366 B2 | 4/2007 | Tsai |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,371,649 B2 | 5/2008 | Cheng |
| 7,381,608 B2 | 6/2008 | Brask |
| 7,384,880 B2 | 6/2008 | Brask |
| 7,470,570 B2 | 12/2008 | Beintner |
| 7,488,656 B2 | 2/2009 | Cartier |
| 7,501,336 B2 | 3/2009 | Doyle |
| 7,521,324 B2 | 4/2009 | Ohmi |
| 7,531,437 B2 | 5/2009 | Brask |
| 7,569,857 B2 | 8/2009 | Simon et al. |
| 7,601,648 B2 | 10/2009 | Chua |
| 7,659,157 B2 | 2/2010 | Greene |
| 7,732,874 B2 | 6/2010 | Zhu |
| 7,755,144 B2 * | 7/2010 | Li et al. .................... 257/368 |
| 7,824,990 B2 | 11/2010 | Chang |
| 2004/0007561 A1 | 1/2004 | Nallan |
| 2004/0195624 A1 | 10/2004 | Liu |
| 2005/0051825 A1 | 3/2005 | Fujiwara |
| 2005/0202624 A1 | 9/2005 | Li |
| 2005/0275035 A1 | 12/2005 | Mathew |
| 2006/0054943 A1 | 3/2006 | Li |
| 2006/0094192 A1 | 5/2006 | Yang |
| 2006/0099830 A1 | 5/2006 | Walther |
| 2006/0172548 A1 | 8/2006 | Wu |
| 2006/0211259 A1 | 9/2006 | Maes |
| 2006/0284271 A1 | 12/2006 | Doyle |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0070395 A1 | 3/2008 | Yen |
| 2008/0157208 A1 | 7/2008 | Fischer |
| 2008/0157231 A1 | 7/2008 | Wang |
| 2009/0057787 A1 | 3/2009 | Matsuki |
| 2009/0124097 A1 | 5/2009 | Cheng |
| 2009/0179283 A1 | 7/2009 | Adams |
| 2009/0242964 A1 | 10/2009 | Akil |
| 2009/0269916 A1 | 10/2009 | Kang |
| 2010/0048027 A1 | 2/2010 | Cheng |
| 2010/0062592 A1 | 3/2010 | Clark |
| 2010/0068877 A1 | 3/2010 | Yeh |
| 2010/0072553 A1 | 3/2010 | Xu |
| 2010/0075507 A1 | 3/2010 | Chang |
| 2010/0081262 A1 | 4/2010 | Lim |
| 2010/0087043 A1 * | 4/2010 | Cheng et al. .................. 438/424 |
| 2010/0144121 A1 | 6/2010 | Chang |
| 2010/0167506 A1 | 7/2010 | Lin |
| 2010/0184281 A1 | 7/2010 | Hsu |
| 2010/0219481 A1 | 9/2010 | Tseng |

* cited by examiner

METHOD FOR FORMING A FINFET STRUCTURE

BACKGROUND OF THE INVENTION

1. Field of the Invention

The present invention relates generally to fin-type field effect transistors (FinFET) and more particularly to the method for forming an improved FinFET structure that includes multiple gate dielectric thicknesses.

2. Description of the Prior Art

Semiconductor structure includes both passive semiconductor devices such as resistors, as well as active devices such as transistors and diodes. Field effect transistor devices are common transistor devices within semiconductor structures.

Field effect transistor structure and device dimensions have been scaled effectively to increasingly smaller dimensions over the period of several decades. Various field effect transistor structures having desirable properties are known in the semiconductor fabrication art. One recent advance in transistor technology is the introduction of fin type field effect transistors that are known as FinFET.

In the conventional process, the method for forming individual FinFETs on one substrate comprises: first, a substrate having at least two fin structure is provided, and a first oxide layer is then formed on these two fin structures, next, parts of the first oxide layer, especially the portion that covers on one of the fin structure is then removed, afterwards, a second oxide layer is then formed on the exposed fin structure. However, since there is no other layer that is formed during the process, the fin structure or the isolating region surrounding each fin structure is easily damaged by the etching processes, influencing the yield and the performance of the FinFET.

SUMMARY OF THE INVENTION

The present invention provides a method for forming a FinFET structure, at least comprising the following steps: first, a substrate is provided, a first region and a second region are defined on the substrate, a first fin structure and a second fin structure are disposed on the substrate, within the first region and the second region respectively, a first oxide layer covering the first fin structure and the second fin structure, next a first protective layer and a second protective layer are entirely formed on the substrate and the first oxide layer in sequence, the second protective layer within the first region is removed, the first protective layer within the first region is then removed, afterwards, the first oxide layer covering the first fin structure and the second protective layer within the second region are removed simultaneously, and a second oxide layer is formed to cover the first fin structure.

The features of the present invention further comprise a first protective layer and a second protective layer, which are made of different materials, for example, in the embodiment mentioned above. The first protective layer comprises silicon nitride, and the second protective layer comprises silicon oxide, and these two dielectric layers protect the oxide region disposed in the substrate and surrounding the fin structure from the damages occurring during the etching processes. Besides, since the silicon nitride first protective layer has high selectivity with the first oxide layer disposed on the fin structure and the oxide region, so during the process for removing the silicon nitride first protective layer, the first oxide layer and the oxide region will not be ruined by the etching processes, thereby enhancing the yield and the performance of the FinFET.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
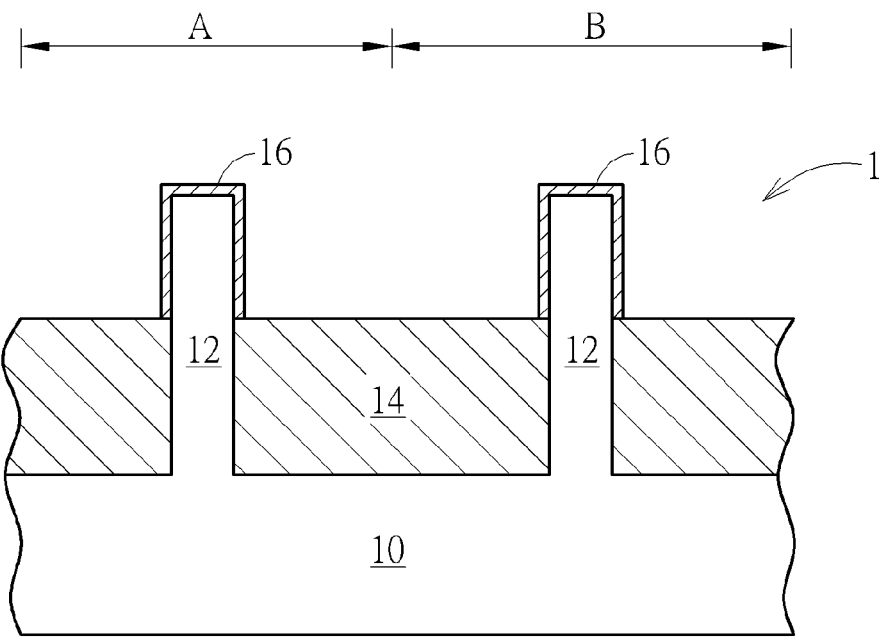
FIGS. 1-9 are schematic diagrams showing the manufacturing process for forming a FinFET structure according to one preferred embodiment of the present invention.

FIG. 1-9 are schematic diagrams showing the manufacturing process for forming a FinFET structure according to one preferred embodiment of the present invention. As shown in FIG. 1, first, a substrate 10 is provided, such as a silicon substrate. There are at least two fin structures 12 on the substrate 10, and an oxide region 14, disposed on the substrate 10 and surrounding the fin structure 12. Usually, the oxide region such as the shallow trench isolation (STI), is used to isolate different components on the substrate 10. A first oxide layer 16 is disposed on the fin structures 12, but does not cover the oxide region 14. In other words, the oxide region 14 is exposed. In addition, there are two regions: a first region A and a second region B which are defined on the substrate, the region A and region B comprising at least one fin structure 12 therein. It is worth noting that in the following process, devices with different oxide layer thicknesses will be formed in the region A and in the region B respectively, such as the low voltage (LV) devices, the memory, the core devices, electrostatic-sensitive device (ESD), IO devices or high voltage (HV) devices, and these devices have different oxide layer thicknesses.

Figure 2:
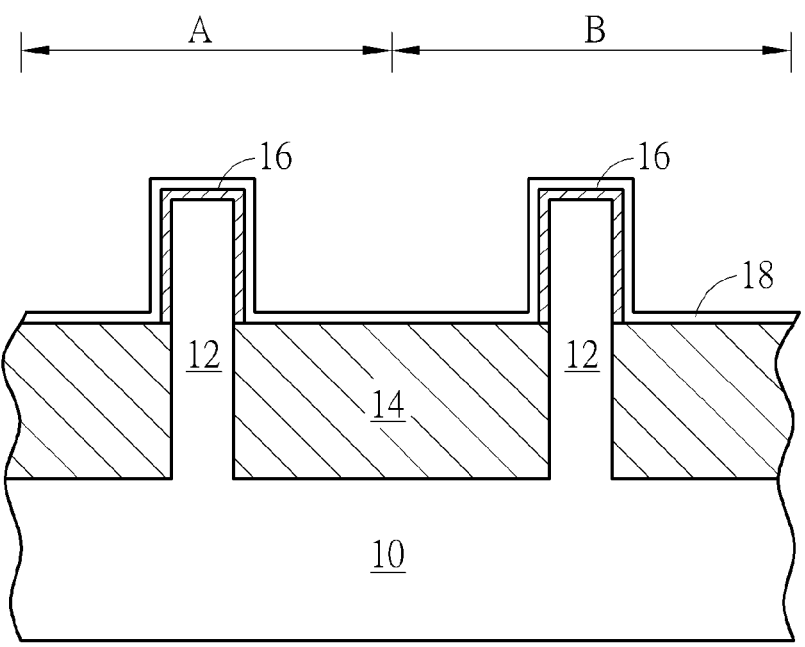
Figure 3:
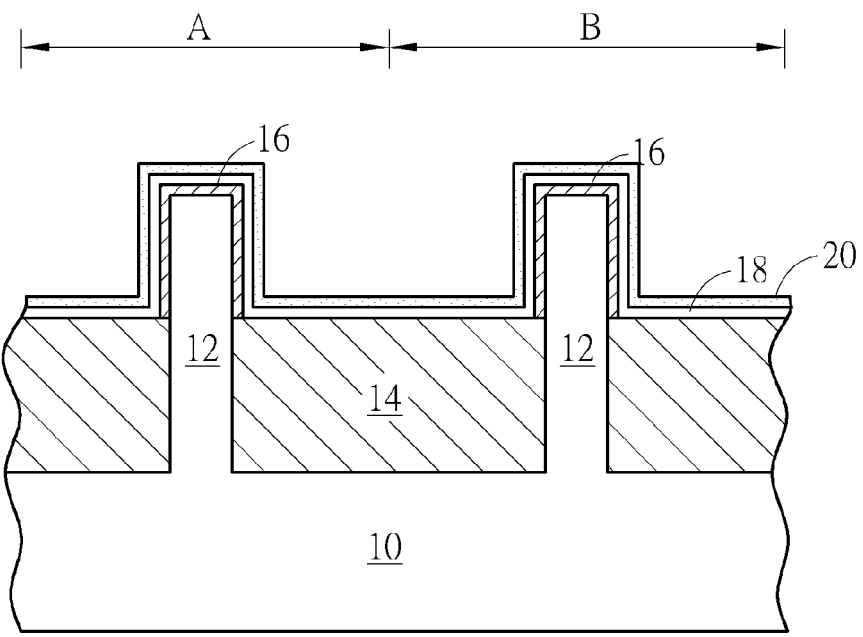

Please refer to FIGS. 2-3, a first protective layer 18 and a second protective layer 20 are then formed in sequence, covering the first oxide layer 16 and the oxide region 14. In this embodiment, the first protective layer 18 comprises silicon nitride, and the second protective layer 20 comprises silicon oxide. The first protective layer 18 and the second protective layer 20 are preferably formed through an atomic layer deposition (ALD) process, but not limited thereto.

Figure 4:
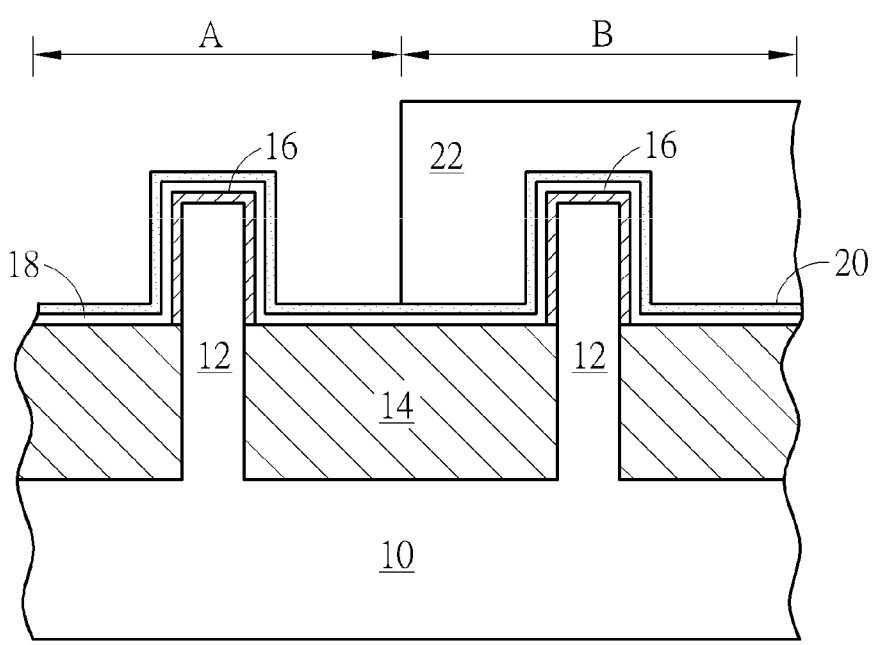
Figure 5:
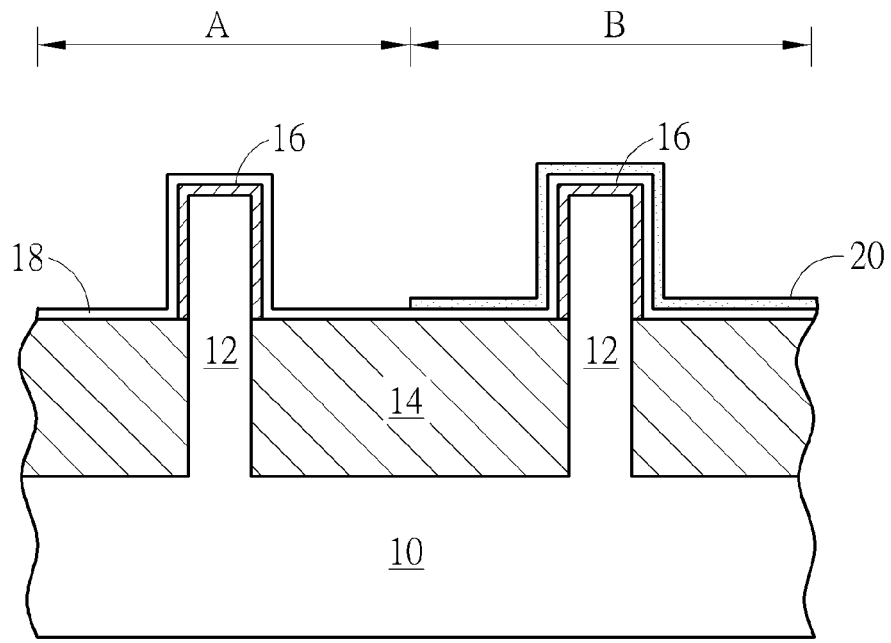

Next, please refer to FIGS. 4-5. As shown in FIG. 4, a patterned photoresist layer 22 is formed on the second protective layer 20 within the second region B. As shown in FIG. 5, an etching process (not shown) is then performed, to remove parts of the second protective layer 20 which are not covered by the photoresist layer 22. In other words, only the second protective layer 20 within the first region A is removed. Afterwards, the patterned photoresist layer 22 is then removed. In this embodiment, the etching process for removing the second protective layer 20 comprises a dilute hydrofluoric acid (DHF) containing cleaning process, a sulfuric acid-hydrogen peroxide mixture (SPM) containing cleaning process or a standard clean 1 (SC1) process, but not limited thereto. It is worth noting that, in this step, the first protective layer 18 still remains on the oxide region 14 and on the first oxide layer 16, helping protect the first oxide layer 16 and the oxide region 14 from damages occurring during the etching process.

Figure 6:
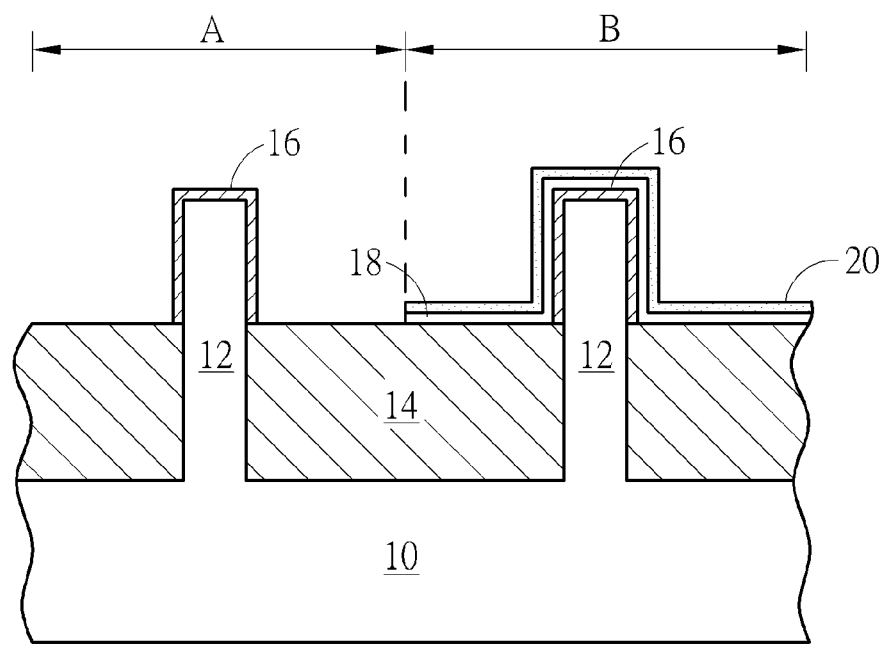

Please refer to FIG. 6. Another etching process is then performed to remove the first protective layer 18 within the first region A. In this step, the etching process uses the solvent such as phosphate (H3PO4) which has high selectivity to the silicon nitride and the silicon oxide. In other words, only the first protective layer 18 mainly made of silicon nitride can easily be removed by the etching process, but the second protective layer 20 and the oxide region 14 mainly made of silicon oxide are hardly removed by the etching process, so the oxide region 14 disposed under the first protective layer 18 is not easily ruined by the etching process.

Figure 7:
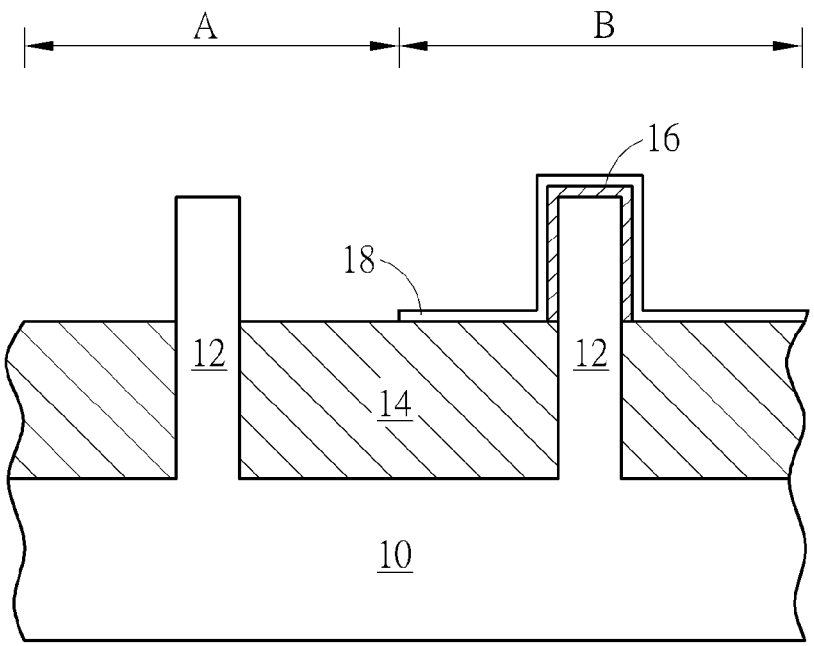

Please refer to FIG. 7. An etching process (not shown) is performed, to remove the first oxide layer 16 disposed on the fin structure 12 within the region A, and the second protective layer 20 within the second region B simultaneously, so as to completely remove the first oxide layer 16 and to expose the fin structure 12 within the first region A. Since in this embodiment, both the first oxide layer 16 and the second protective layer 20 mainly comprise silicon oxide, they can be removed in a same etching process simultaneously. It is worth noting that, in order to avoid the oxide region 14 being damaged by the etching process, in this step, the etching process preferably selects a dry-etching process. Usually, a dry-etching process has a better performance in controlling the etching rate, so compared with a wet-etching process, a dry-etching process is a preferred choice to avoid the oxide region 14 from being damaged.

Figure 8:
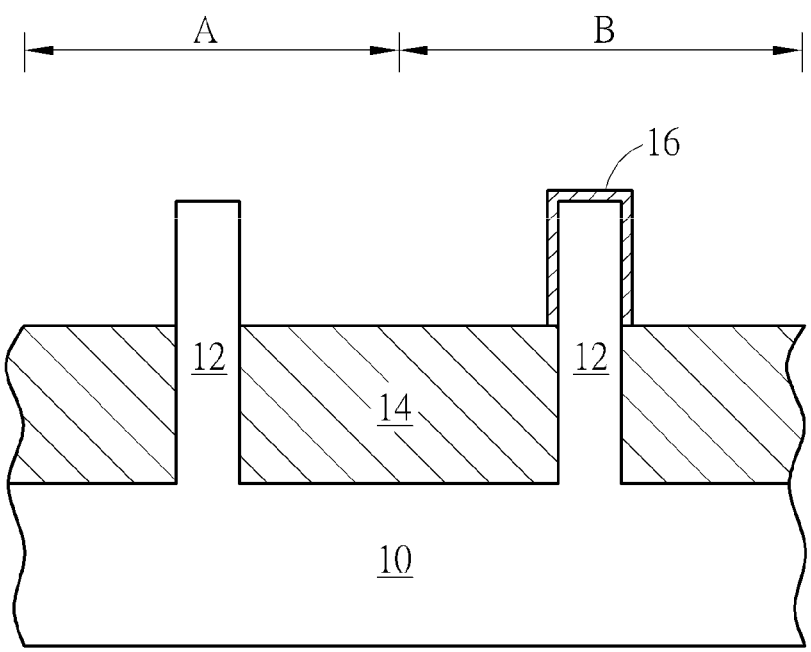
Figure 9:
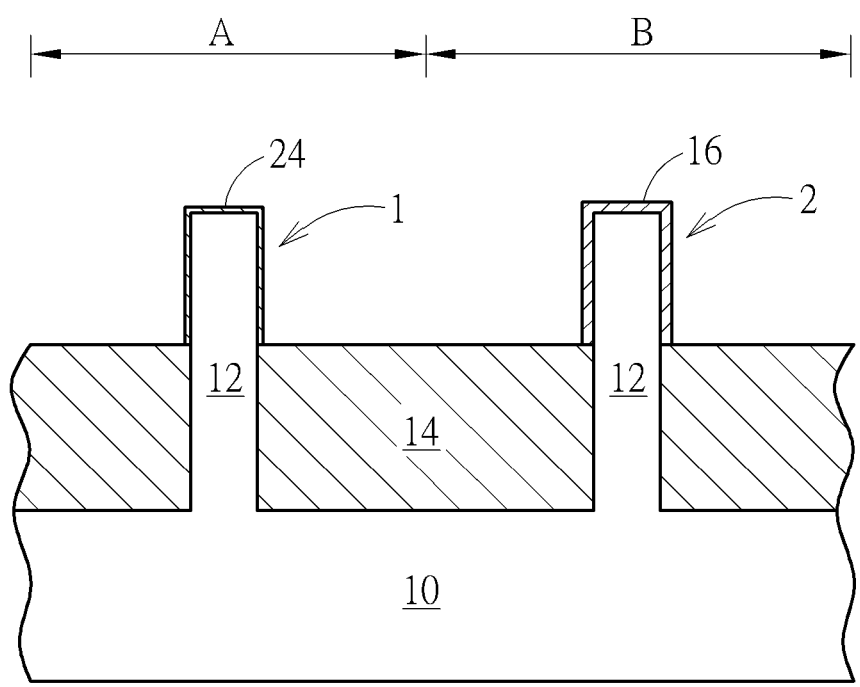

Afterwards, referring to FIGS. 8-9, the first protective layer 18 within the first region B is then removed, and as shown in FIG. 9, a second oxide layer 24 is then formed to cover the exposed fin structure 12 within the first region A. It is worth noting that the thickness of the first oxide layer 16 and the second oxide layer 24 are different. Preferably, the first oxide layer 16 is thicker than the second oxide layer 24, thereby achieving two individual FinFETs on one substrate 10. For example, a FinFET 1 and a FinFET 2 are a n-FET device and a p-FET device respectively, or selected from the group of the low voltage (LV) devices, the memory, the core devices, electrostatic-sensitive device (ESD), IO devices or high voltage (HV) devices, and these devices have different oxide layer thicknesses, having individual work functions.

In another case of the present invention, after the second protective layer 20 within the second region B is removed (corresponding to FIG. 7), the second oxide layer 24 can be formed before the first protective layer 18 within the second region B is removed. In other words, the first protective layer 18 within the second region B may remain until the second oxide layer 24 is formed. This process should be contained in the scope of the present invention. However, preferably forming the second oxide layer 24 is the final process in order to avoid the second oxide layer 24 being exposed in air for a long time and influencing the performance of the FinFET caused by oxidation.

In summary, the distinguishing feature of the present invention is the use of a first protective layer and a second protective layer, which are made of different materials. For example, in the embodiment mentioned above, the first protective layer comprises silicon nitride, and the second protective layer comprises silicon oxide. These two dielectric layers protect the oxide region disposed in the substrate and surround the fin structure from the damages occurring during the etching processes. Besides, since the silicon nitride first protective layer has high selectivity with the first oxide layer disposed on the fin structure and the oxide region, during the process for removing the silicon nitride first protective layer, the first oxide layer and the oxide region are not ruined by the etching processes, thereby enhancing the yield and the performance of the FinFET.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a FinFET structure, at least comprising the following steps:
    providing a substrate, a first region and a second region being defined on the substrate, a first fin structure and a second fin structure being disposed on the substrate within the first region and the second region respectively, a first oxide layer covering the first fin structure and the second fin structure;
    forming a first protective layer and a second protective layer entirely on the substrate and the first oxide layer in sequence;
    removing the second protective layer within the first region;
    removing the first protective layer within the first region;
    removing the first oxide layer covering the first fin structure and the second protective layer within the second region; and
    forming a second oxide layer covering the first fin structure.

2. The method of claim 1, wherein the first oxide layer is thicker than the second oxide layer.

3. The method of claim 1, wherein the first oxide layer covering the first fin structure and the second protective layer within the second region are removed simultaneously.

4. The method of claim 1, wherein the first protective layer comprises a silicon nitride layer.

5. The method of claim 1, wherein the second protective layer comprises a silicon oxide layer.

6. The method of claim 1, further comprising removing the first protective layer within the second region after the second protective layer within the second region is removed.

7. The method of claim 6, wherein the second oxide layer is formed after the first protective layer within the second region is removed.

8. The method of claim 6, wherein the second oxide layer is formed before the first protective layer within the second region is removed.

9. The method of claim 1, further comprising forming an oxide region disposed in the substrate, surrounding the first fin structure and the second fin structure.

10. The method of claim 1, wherein the surface of the first fin structure is exposed after the first oxide layer is removed from the first fin structure.

11. The method of claim 1, wherein the method for removing the first oxide layer covering the first fin structure and the second protective layer within the second region comprises a dry-etching process and a wet-etching process.

* * * * *